(12) United States Patent
Karlsson

(10) Patent No.: US 6,332,618 B1
(45) Date of Patent: Dec. 25, 2001

(54) DOUBLE SIDED GASKET

(75) Inventor: Peter Karlsson, Malmö(SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/399,157

(22) Filed: Sep. 20, 1999

(51) Int. Cl.[7] .............. F16J 15/02; F16J 15/08; H05K 9/00; H05K 5/00; F16F 1/18
(52) U.S. Cl. .............. 277/648; 277/650; 277/920; 277/649; 174/35 CG; 174/35 MS; 174/17 CT; 267/36.1; 267/41
(58) Field of Search .............. 277/630, 637, 277/640, 648, 649, 650, 920; 174/35 GC, 35 MS, 17 CT; 267/36.1, 41, 47, 160, 164, 165; 411/165, 163, 164, 160, 162

(56) References Cited

U.S. PATENT DOCUMENTS

| | | | |
|---|---|---|---|
| 2,707,012 | * | 4/1955 | Cox . |
| 3,826,583 | * | 7/1974 | Pare . |
| 4,055,208 | * | 10/1977 | Blaul . |
| 4,061,413 | | 12/1977 | Keller . |
| 5,204,496 | * | 4/1993 | Boulay et al. . |
| 5,409,200 | * | 4/1995 | Zingher et al. . |
| 5,534,662 | * | 7/1996 | Peacock et al. . |
| 5,682,299 | * | 10/1997 | Kunert . |
| 5,825,634 | * | 10/1998 | Moorehear, Jr. . |
| 5,917,147 | * | 6/1999 | Lewis . |
| 5,957,465 | * | 9/1999 | Gonsalves et al. . |

FOREIGN PATENT DOCUMENTS

| | | |
|---|---|---|
| 23 48 686 | 4/1975 | (DE) . |
| 24 48 421 | 6/1975 | (DE) . |
| 2448421B | 6/1975 | (DE) . |
| 299 06 262 | 7/1999 | (DE) . |
| 2 078 686 | 11/1971 | (FR) . |
| 1321 140 | 6/1973 | (GB) . |
| WO 99/33328 | 7/1999 | (WO) . |
| WO99/33328 | 7/1999 | (WO) . |

* cited by examiner

Primary Examiner—Anthony Knight
Assistant Examiner—Vishal Patel
(74) Attorney, Agent, or Firm—Burns, Doane, Swecker & Mathis, L.L.P.

(57) ABSTRACT

A metal gasket for preventing leakage of radio frequency signals when mounting shielded radio electronics includes gasket body having a first surface and an opposite second surface and a plurality of spring arms. Each spring arm includes a free proximal portion and a free distal portion and a connection connecting the spring arm to the body portion. Each spring arm is configured so that the distal portion contacts a component proximate the first surface of the body portion and the proximate portion of each spring arm contacts a second component proximate the second surface of the body. Preferably, the distance between adjacent contacts on a component is less than or approximately equal to a predetermined ratio of a shielded radio wavelength.

27 Claims, 7 Drawing Sheets

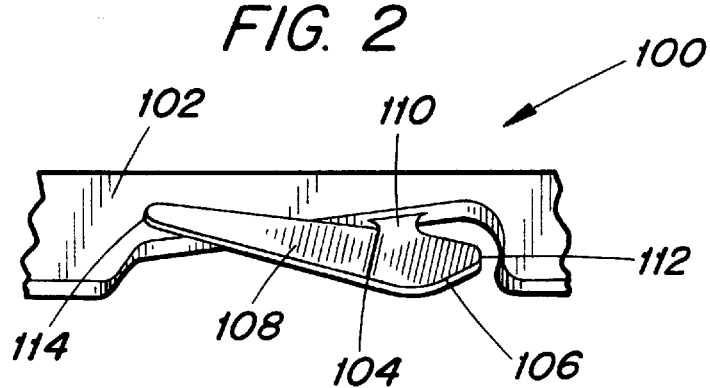
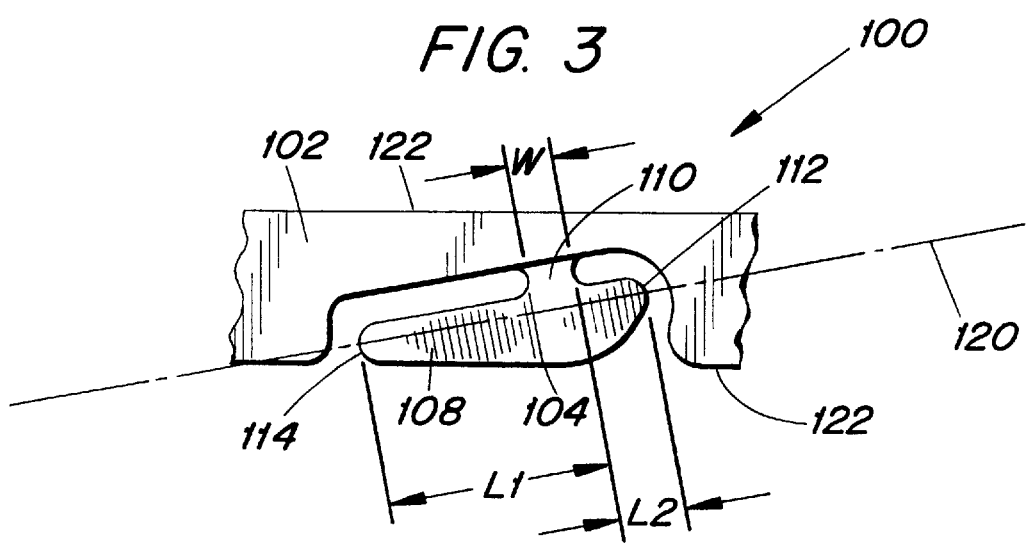
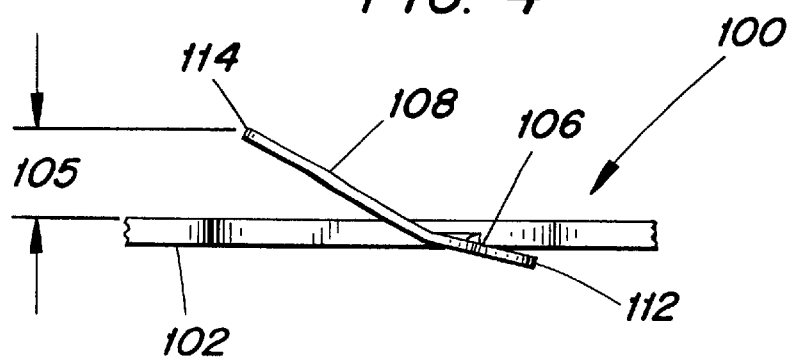

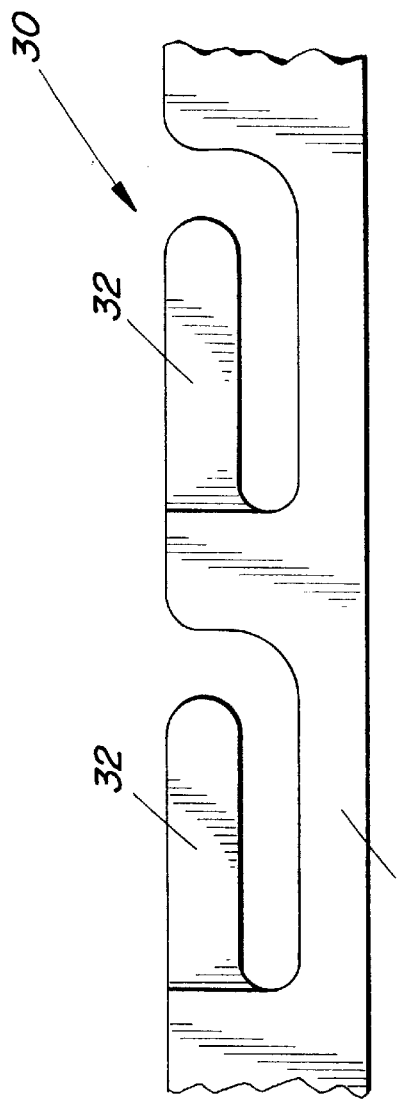
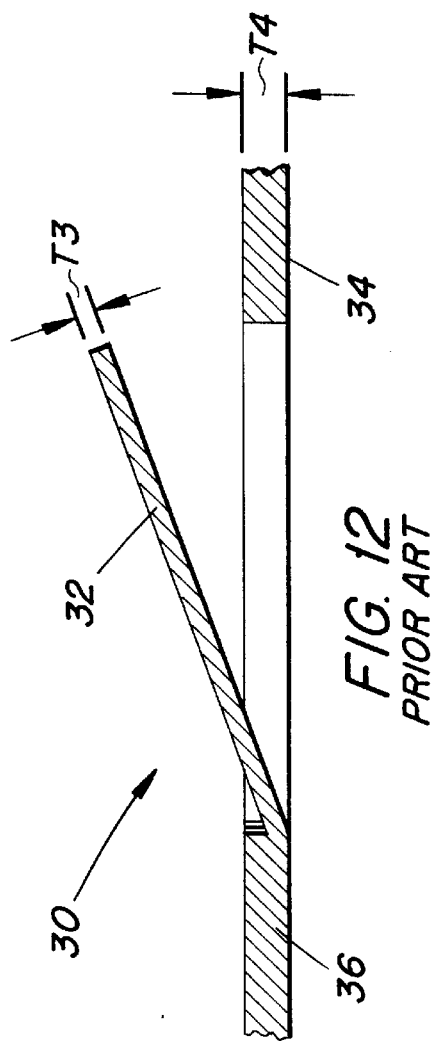
FIG. 11
PRIOR ART
FIG. 12
PRIOR ART

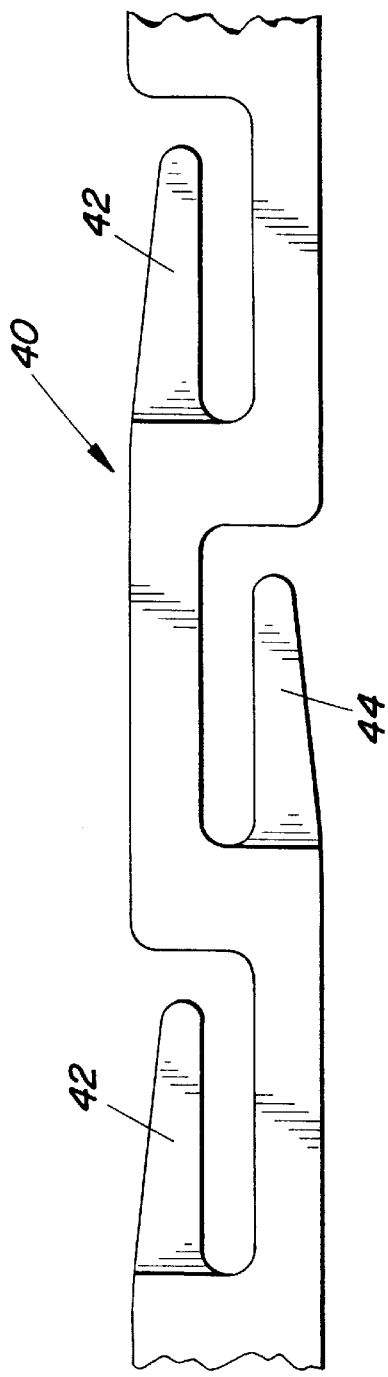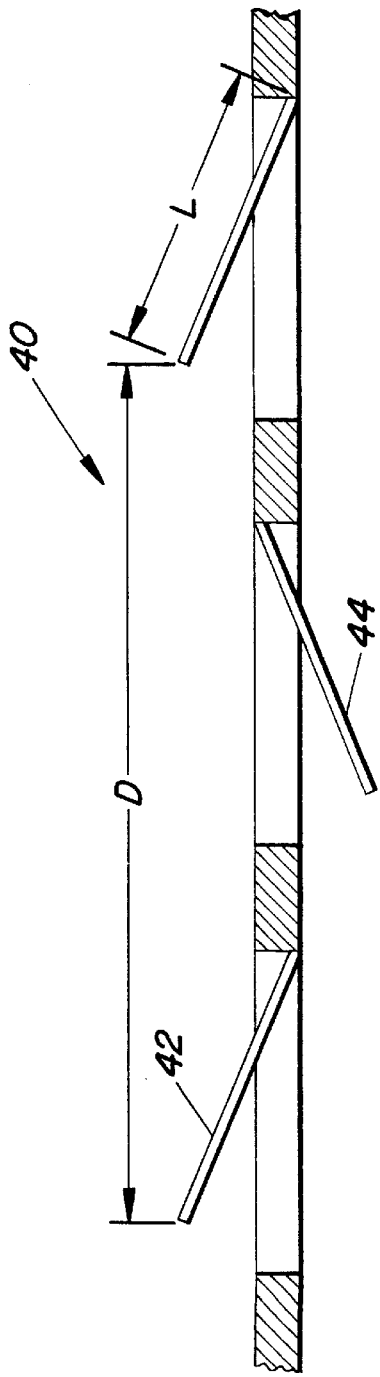
FIG. 13 PRIOR ART
FIG. 14 PRIOR ART

DOUBLE SIDED GASKET

BACKGROUND

The present invention relates to gaskets which prevent leakage of radio frequency signals when mounting shielded radio electronics. Specifically, such gaskets can be used to achieve a safe connection between a shielding box and a printed circuit board (PCB) in devices such as radio telephones.

In order to prevent the leakage of radio frequency signals between components of radio electronics devices, a gasket must ensure good contact between the surfaces of the two mounted components. Adequate contact requires that the distance between contact points should be less than or approximately equal to a predetermined ratio (e.g., 1/20th) of the wavelength of the radio frequency to be shielded. As the radio frequency increases, the wavelength decreases. Therefore, effective shielding of high radio frequencies requires a shorter distance between adjacent contact points than low radio frequencies. Because the surface of one or both of the components can be rough or uneven, it is desirable that the gasket include flexible extensions such as spring arms which contact the adjacent component at finite contact points. A gasket having a flat or inflexible contact surface is likely to allow large or difficult to predict distances between contact points with an adjacent component surface.

One conventional gasket design 20 is shown in FIGS. 9 and 10. This gasket 20 includes a plurality of spring arms 22. Each spring arm 22 has one free end 24 which projects out of one side of a gasket body 26. A component which is mounted adjacent to that side of the gasket body 26 is, at minimum, contacted at areas separated by a contact surface D. Each spring arm 22 is stamped out of the gasket body 26, and therefore has a thickness T1 equivalent to a thickness T2 of the gasket body 26. As a result, if a low spring constant, and therefore thin spring arm 22 is desired, the gasket body 26 itself must be equally as thin. A disadvantage of this design is that the thinner the gasket body 26, the more difficult the gasket body 26 is to mount and assemble. A second disadvantage of this design is that the side of the gasket body 26 opposite the side from which spring arms 22 project presents a generally flat surface 28 to one of the components between which the gasket 20 is mounted. The flat surface 28 does not ensure known contact points with a component adjacent the flat surface 28. Absent known contact points, the shielding effect of the gasket 20 can be compromised if the component adjacent the flat surface 28 of the gasket has a rough or uneven surface, causing the gasket to have contact gaps greater in length than the wavelength of the radio frequency to be shielded.

FIGS. 11 and 12 show a conventional gasket 30 of similar construction to the gasket 20 shown in FIGS. 9 and 10. However, gasket 30 has spring arms 32 each having a thickness T3 smaller than the thickness T4 of the gasket body 34. This arrangement is achieved by etching the spring arm 32 into the metal material which forms the gasket 30. Nonetheless, this configuration still presents a flat surface 36 to one of two components between which the gasket 30 is mounted.

The conventional gasket 40 shown in FIGS. 13 and 14 attempts to solve the problem of indefinite contact points inherent in a flat gasket surface by alternating downwardly projecting spring arms 42 and upwardly projecting spring arms 44. However, this configuration requires that for a given length spring arm L, the distance between contact points D1 on a component surface is about twice the length L. This design makes it difficult to maintain both a long spring arm, which has a long travel or tolerance for roughness or unevenness in a component surface, and a minimum small distance between adjacent contact points on the component surface adjacent the gasket 40. In addition, this design requires two bending steps (one to form the upwardly projecting spring arms 44 and one to form the downwardly projecting the spring arms 42) to form the gasket 40, making such a gasket difficult to manufacture.

Accordingly, a need exists for a gasket that includes spring arms that project from opposite sides of a gasket body 26, while still providing at least one set of long spring arms having low spring constants and maintaining proportionally small distances between adjacent ends of each set of spring arms.

SUMMARY

In accordance with one aspect of the invention, a gasket for mounting shielded electronics includes a body and a plurality of spring arms connected to the body. Each spring arm includes a free proximal portion, a free distal portion and a connection connecting the spring arm to the body. The free distal portion of each spring arm contacts a first component proximate to a first surface of the body. The free proximate portion of each spring arm contacts a second component proximate to an opposite second surface of the body. The distance between adjacent contacts on a component is less than or approximately equal to a predetermined ratio of a shielded radio wavelength.

In accordance with another aspect of the invention, a method for mounting shielded electronics to a frame is disclosed. According to the method, a gasket including a body and a plurality of spring arm portions are provided. Each spring arm includes a proximal portion, a distal portion and a connection connecting the spring arm to the body. A first component adjacent to a first surface of the body is contacted by the distal portion of each arm, and a second component adjacent to a second surface of the body is contacted by the proximal portion of each arm. The distal and proximal portions contact respective components such that the distance between adjacent contacts on a component is less than or approximately equal to a predetermined ratio of a shielded radio wavelength. Subsequently, the first component is secured to the second component.

BRIEF DESCRIPTION OF THE DRAWINGS

The objects and advantages of the invention will be understood in view of the drawings in which:

FIG. 2 is an perspective view of a first embodiment of the present invention;

FIG. 3 is a top plan view of the embodiment shown in FIG. 1;

FIG. 4 is a sectional view of the invention shown in FIGS. 2 and 3;

FIG. 11 is a top plan view of a second conventional device;

FIG. 12 is a side sectional view of the device shown in FIG. 11;

FIG. 13 is a top plan view of a third conventional device; and

FIG. 14 is a side sectional view of the device shown in FIG. 13.

DETAILED DESCRIPTION

For a better understanding of the invention, the following detailed description refers to the accompanying drawings, wherein exemplary embodiments of the present invention are illustrated and described.

A gasket according to the present invention includes a plurality of spring arms which each include a proximal portion and a distal portion having contact areas projecting both below and above a plane defined by the gasket body. Thus, contact with adjacent component surfaces both above and below the body of the gasket is assured even if these component surfaces are uneven or rough. In addition, the force needed to ensure adequate contact pressure with the component surfaces is small because the total contact surface of each spring arm portion is small. Furthermore, each spring of a gasket according to the present invention need only be bent once to create contact areas both above and below the body of the gasket.

Figure 1A:
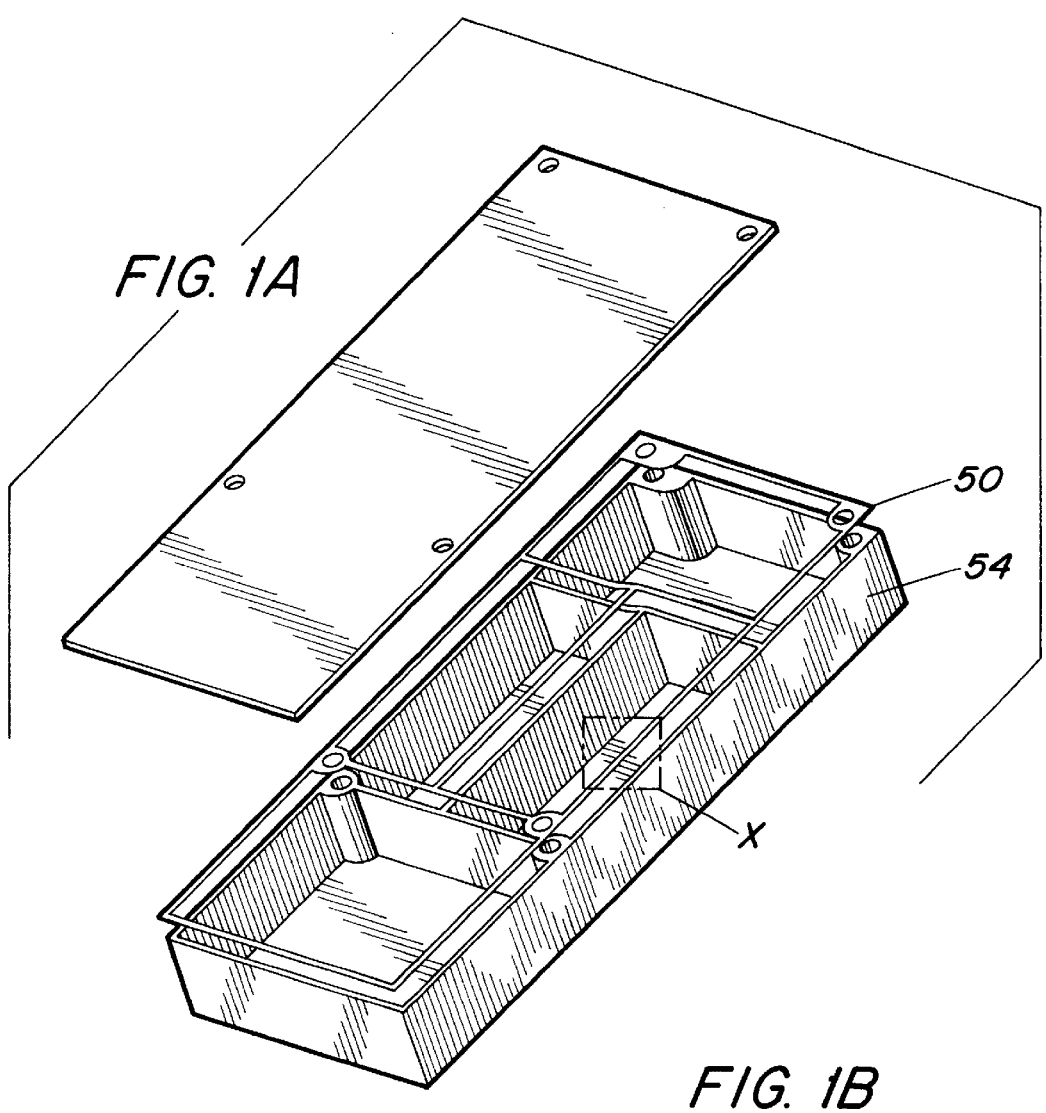
FIG. 1A is an schematic exploded perspective cut away view of a radio telephone including a prior art gasket.
Figure 1B:
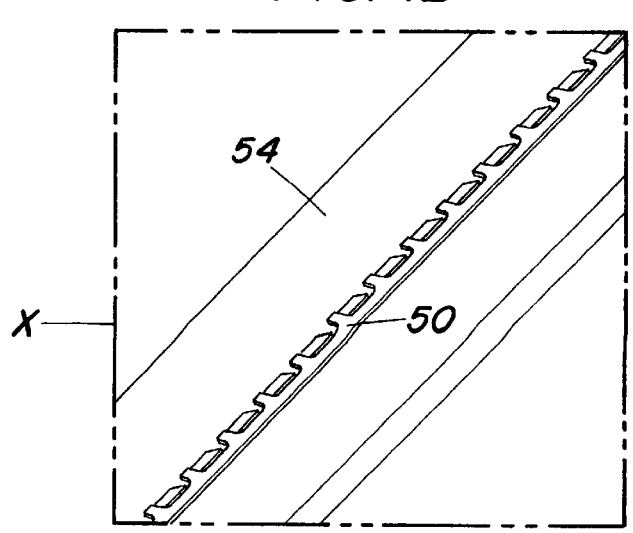
FIG 1B is an enlarged view of the area X in FIG. 1.

FIGS. 1A and 1B show a typical environment in which a gasket according to the present invention is used. Here, a conventional gasket 50 is used to mount a printed circuit board (PCB) 52 to a shielding box or frame 54 in a radio telephone 56. The gasket 50 includes a plurality (e.g., hundreds) of spring arms 58 which contact adjacent component surfaces. Preferably the gasket 50 is about 1 mm wide. In order to shield or prevent the leakage of radio frequency signals between the components, the contact points on a component surface should be less than or approximately equal to a predetermined ratio (e.g., 1/20th) of the radio wavelength corresponding to the radio frequency signal to be shielded.

A first embodiment of the present invention is shown in FIGS. 2–4. In the first embodiment, a gasket 100 includes a body 102 and a plurality of spring arms 104. Each spring arm 104 has asymmetrical proximal and distal portions 106, 108 arranged on either side of a connection 110 which connects the spring arm 104 to the body of the gasket 100. As an example, for spring arms 104 which are about 0.05 mm thick and which create contact points separated by about 2.5 mm, the connection 110 has a width W of, for example, about 0.2 mm. Both the distal portion 108 and the proximal portion 106 have corresponding free ends 114, 112. The distal free end 114 can project past a first surface 116 of the gasket body 102 while the proximal free end 112 projects past an opposite second surface 118 of the gasket body 102. The distal portion 108 of the spring arm 104 has a length L1 greater than the length L2 of the proximal portion 106 of the spring arm 104. For the exemplary spring arms having the above dimensions, L1 can be about 1.6 mm and L2 can be about 0.45 mm. The long distal portion 108 of the spring arm 104 has a long travel or tolerance 105 to ensure contact with an uneven or rough surface of a first component such as a PCB. The shorter proximal end 112 of each spring arm creates the desired defined contact points with the second component surface, such as a radio telephone frame.

Each spring arm 104 is bent at the connection 110 so that the proximal and distal portions 106, 108 of each spring arm 104 project out of the opposite surfaces 116, 118 of the gasket body 102. Because each spring arm 104 is asymmetrical around the connection 110, the distance between distal ends 144 of adjacent spring arms of a particular length is less than the distance between distal ends of symmetrically configured spring arms. Therefore, long spring arms can contact adjacent components with relatively short distances between adjacent distal portions.

Because the distal portion 108 has a length greater than the proximal portion 106, its spring constant, K1, is less than the spring constant of the proximal portion, K2. The connection 110 contributes to the elasticity of the arm and has a torsional spring constant K3. The overall spring constant K of each spring arm 104 is related to the other spring constants by the equation $$\frac{1}{K} = \frac{1}{K1} + \frac{1}{K2} + \frac{1}{K3}.$$

Thus, the overall spring constant for each spring arm 104 is less than any one of the three other spring constants. A low spring constant is desirable because for a given compressing force, a spring arm will accommodate a range of movement in response to roughness or unevenness proportional to the spring constant.

Preferably, each spring arm 104 is formed to define a spring arm axis 120 at an angle with respect to edges 122 of the gasket body 102 in order to define a substantial portion of the gasket body 102 between adjacent spring arms. The larger the portion of the gasket body 102 between spring arms, the more robust and durable the gasket 100. This configuration also allows one of the proximal or distal portions 106, 108 to contact a component near the center of the gasket body 102 and the other portion to contact a component near an edge of the gasket body 102.

Figure 5:
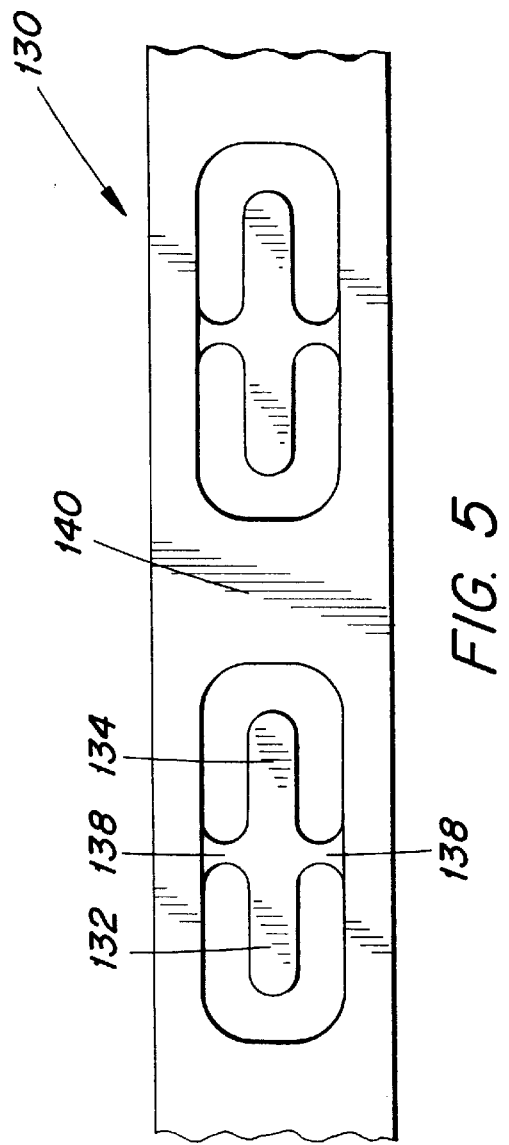
FIG. 5 is a top plan view of a second embodiment of the present invention.
Figure 6:
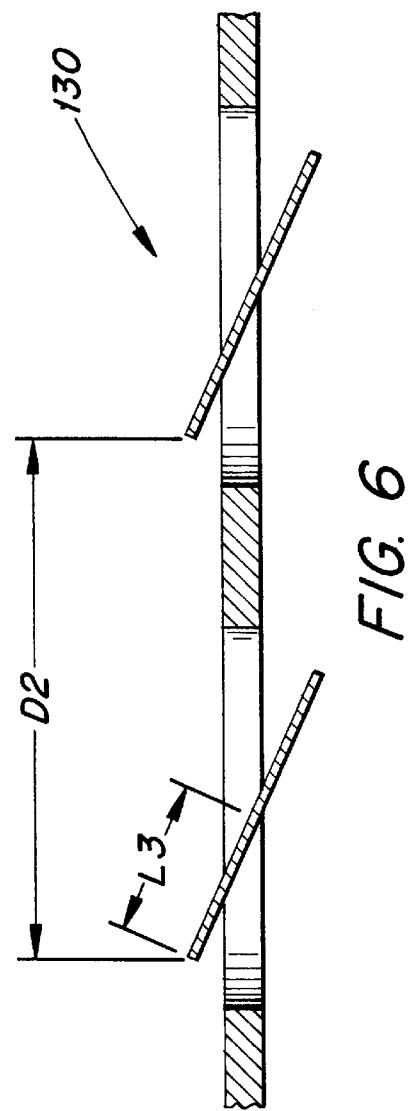
FIG. 6 is a sectional view of the invention shown in FIG. 5.

FIGS. 5 and 6 show a second embodiment of a gasket 130 according to the present invention where proximal and distal portions 132, 134 of a spring arm 136 are symmetrical about connections 138. The connections 138 connect the spring arm 136 to a body 140 of the gasket 130. In this embodiment, for a given distance D2 (e.g., 2.5 mm) between adjacent contact points, the length L3 of the proximal and distal portions 134, 136 is smaller than the first embodiment because each distal portion is offset from adjacent distal portions by a proximal portion having the same length. As a result, the overall spring constant of each spring arm is more dependent on the torsional spring constant of the connections 138, than is the spring arm of the first embodiment.

Figure 7:
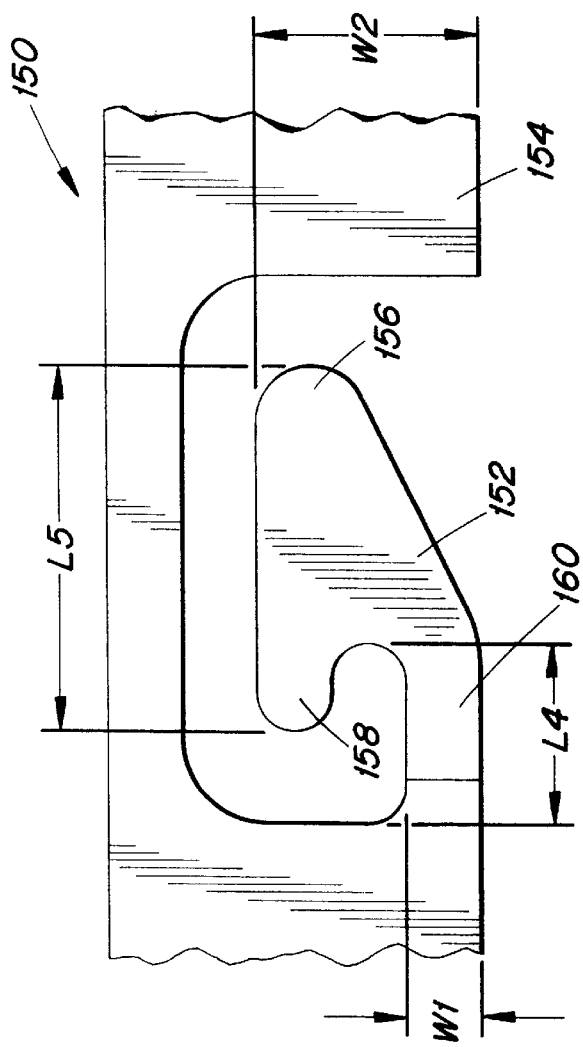
FIG. 7 is a top plan view of a third embodiment of the present invention.
Figure 8:
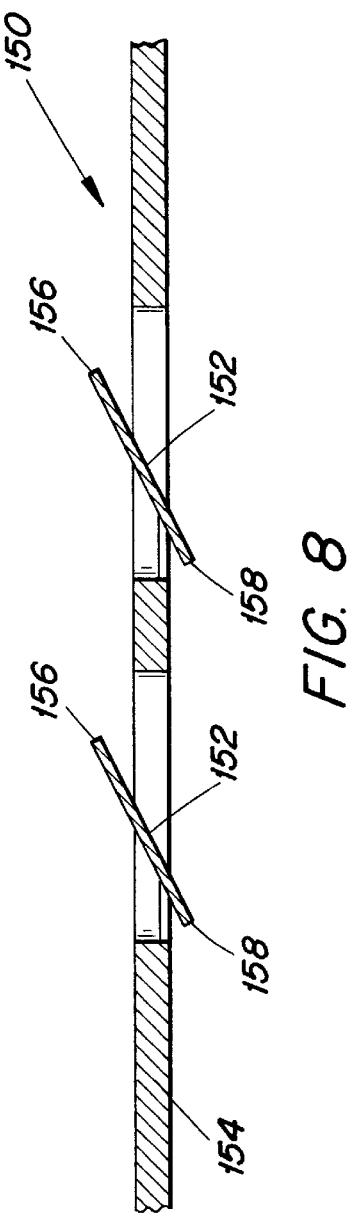
FIG. 8 is a sectional side view of the device shown in FIG. 7.
Figure 9:
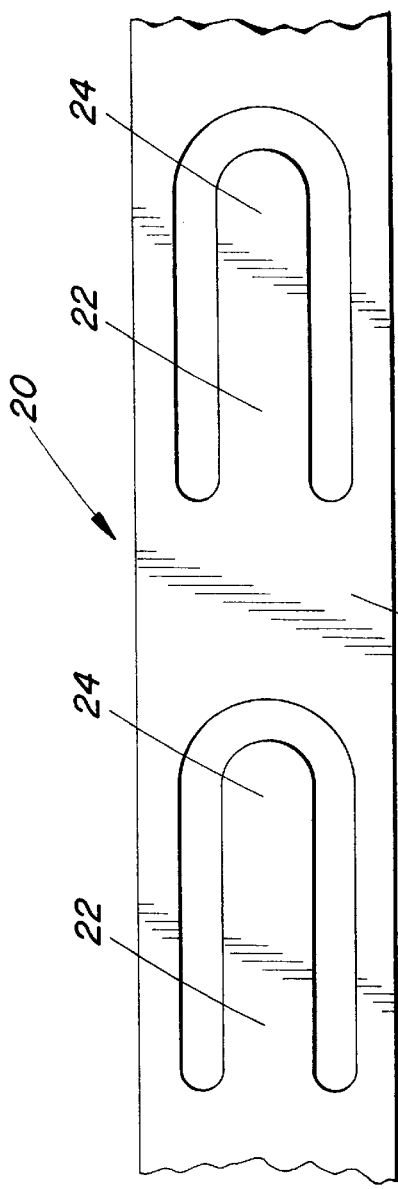
FIG. 9 is a top plan view of a first conventional device.
Figure 10:
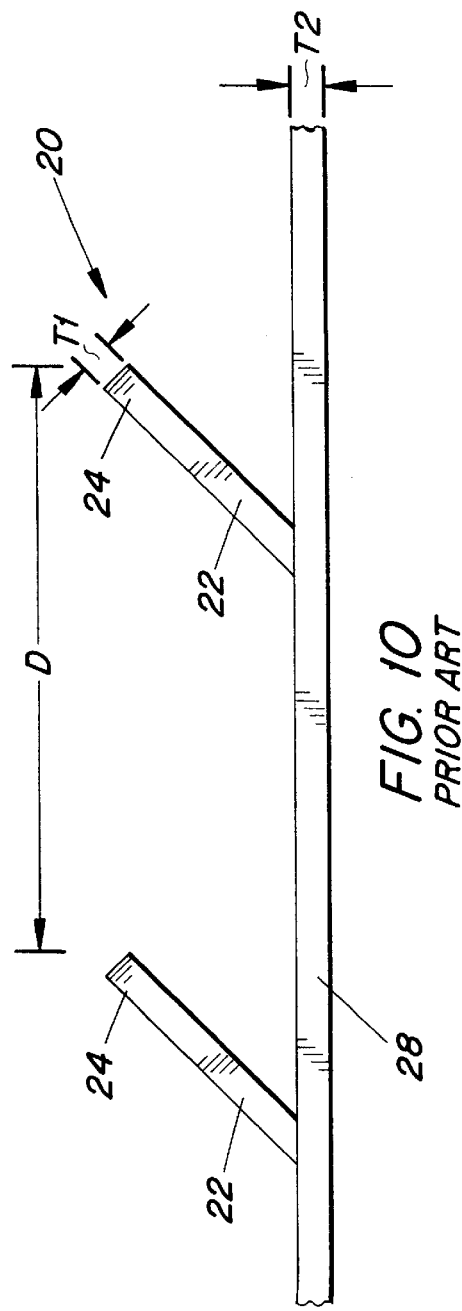
FIG. 10 is a side view of the device shown in FIG. 9.

FIGS. 7 and 8 show a third embodiment of a gasket 150 according to the present invention. The gasket 150 includes a double extension (or U-shaped) spring arm 152 attached to a gasket body 154. The spring arm 152 includes free proximal and distal portions 156, 158. An extended connection 160 attaches the spring arm 152 to the gasket body. For example, for spring arms 152 which are about 0.05 mm thick and which ensure the distance between contact points is about 2.5 mm, the extended connection 160 can have a width W1 of about 0.2 mm and a length L4 of about 0.5 mm. Moreover, in this example, the length of the spring arm L5 can be about 1.0 mm and the total width W2 of the spring arm 152 can be about 0.6 mm.

Due to the extended connection 160, the elasticity of the spring arm 152 is more dependent on pure bending elasticity than torsional elasticity as compared to the other embodiments. As a result, the torsional spring constant between the spring arm 152 and connection 160 is not as significant to the overall spring constant as in the other embodiments. Accordingly, the gasket 150 can have a lower overall spring constant than comparable gaskets according to the other embodiments, and therefore be more tolerant of uneven component surfaces. In addition, the bending force is more evenly distributed through the spring arm 152. As a result, the spring can withstand higher contact pressure without failing as compared to the other embodiments.

Preferably, a spring arm is thin (preferably about 0.05 mm) to achieve a low spring constant. However, a thin gasket body is difficult to assemble and mount. Therefore, in each of the embodiments according to the present invention, the spring arm is preferably thinner than the gasket body. For some radio telephone applications, the gasket is preferably about 1 mm wide. Preferably, the gasket is formed of a metal material. More preferably, the gasket is formed of sheet metal such as stainless steel or spring steel. However, other elastic and electrically conductive materials can be used in accordance with the present invention. The gasket, according to the present invention, can be stamped or etched according to conventional techniques.

In accordance with another aspect of the present invention, a gasket of the present invention can be used to mount shielded components in a radio telephone. Once a gasket is provided, a PCB is contacted with a distal portion of the spring arm, and the frame is contacted with a proximal portion of a spring arm. The PCB and frame are then secured to one another with the gasket arranged therebetween.

The present invention has been described with reference to exemplary embodiments. However, it will be readily apparent to those skilled in the art that it is possible to embody the invention in specific forms other than as described above without departing from the spirit of the invention. The embodiments are illustrative and should not be considered restrictive in any way. The scope of the invention is given by the appended claims, rather than the preceding description, and all variations and equivalents which fall within the range of the claims are intended to be embraced therein.

What is claimed is:

1. A gasket comprising:
   a body having a first surface and a second surface, the second surface opposite the first surface;
   a plurality of spring arms, each spring arm having a free proximal portion, a free distal portion, and a connecting each spring arm to the body;
   the free distal portion of each spring arm is adaptable for contacting a first component adjacent to the first surface of the body and the free proximal portion of each spring arm is adapatable for contacting a second component adjacent to the second surface of the body; and
   wherein the distal portion is longer than the proximal portion.

2. The gasket of claim 1, wherein a distance between the adjacent contacts with a component surface is less than or approximately equal to a predetermined ratio of a shielded radio wavelength.

3. The gasket of claim 1, wherein the gasket is formed of sheet metal.

4. The gasket of claim 1, wherein each spring arm is bent at the connection so that the distal portion projects upward beyond the first surface and the proximal portion projects downward beyond the second surface.

5. The gasket of claim 1, wherein a distance located between adjacent contact points is approximately equal to 2.5 mm.

6. The gasket of claim 1, wherein the first component is a printed circuit board and the second component is a frame.

7. The gasket of claim 1, wherein the connection has a length on the order of a spring arm length.

8. A gasket comprising:
   a body having a first surface and a second surface, the second surface opposite the first surface;
   a plurality of spring arms, each spring arm having a free proximal portion, a free distal portion, and a connecting each spring arm to the body;
   the free distal portion of each spring arm is adaptable for contacting a first component adjacent to the first surface of the body and the free proximal portion of each spring arm is adapatable for contacting a second component adjacent to the second surface of the body; and
   wherein the spring arm is thinner than the body.

9. A gasket comprising:
   a body having a first surface and a second surface, the second surface opposite the first surface;
   a plurality of spring arms, each spring arm having a free proximal portion, a free distal portion, and a connecting each spring arm to the body;
   the free distal portion of each spring arm is adaptable for contacting a first component adjacent to the first surface of the body and the free proximal portion of each spring arm is adapatable for contacting a second component adjacent to the second surface of the body; and
   wherein the distal portion has a spring constant that is less than a spring constant of the proximal portion.

10. A gasket comprising:
    a body having a first surface and a second surface, the second surface opposite the first surface;
    a plurality of spring arms, each spring arm having a free proximal portion, a free distal portion, and a connection each spring arm to the body;
    the free distal portion of each spring arm is adaptable for contacting a first component adjacent to the first surface of the body and the free proximal portion of each spring arm is adapatable for contacting a second component adjacent to the second surface of the body; and
    wherein each spring arm is connected to the body portion by two connections.

11. A method of mounting shielded radio electronics to a frame comprising the steps of:
    providing a gasket including a body portion with a first surface and an opposite second surface and a plurality of spring arms, each arm having a proximal portion, a distal portion and a connection connecting the spring arm to the body;
    contacting a first component with a distal portion of the arm and a second component with the proximal portion of the arm;
    securing the first component to the second component; and
    wherein the distal portion is longer than the proximal portion.

12. The method of claim 11, wherein a distance between adjacent contacts is approximately less than or equal to a predetermined ratio of a shielded radio wavelength.

13. The method of claim 11, wherein the gasket is formed of sheet material.

14. The method of claim 11, further comprising the step of:
    bending each spring arm so that the distal portion projects upward beyond the first surface and the proximal portion projects downward beyond the second surface.

15. The method of claim 11, wherein each arm portion is connected to the body portion by two connections.

16. The method of claim 11, wherein the distance between adjacent contact points is approximately equal to 2.5 mm.

17. The method of claim 11, wherein the first component is a printed circuit board and the second component is a frame.

18. The method of claim 11, wherein the connection has a length on the order of a spring arm length.

19. A method of mounting shielded radio electronics to a frame comprising the steps of:
   providing a gasket including a body portion with a first surface and an opposite second surface and a plurality of spring arms, each arm having a proximal portion, a distal portion and a connection connecting the spring arm to the body;
   contacting a first component with a distal portion of the arm and a second component with the proximal portion of the arm;
   securing the first component to the second component; and
   wherein the spring arm is thinner than the body.

20. A method of mounting shielded radio electronics to a frame comprising the steps of:
   providing a gasket including a body portion with a first surface and an opposite second surface and a plurality of spring arms, each arm having a proximal portion, a distal portion and a connection connecting the spring arm to the body;
   contacting a first component with a distal portion of the arm and a second component with the proximal portion of the arm;
   securing the first component to the second component; and
   wherein the distal portion has a spring constant that is less than a spring constant of the proximal portion.

21. A gasket, comprising:
   a body having a first surface and a second surface, the second surface opposite the first surface;
   a plurality of spring arms, each spring arm comprises a connection which attaches the spring arm to the body;
   an the spring arm is connected to and substantially perpendicular to the connection, the spring arm has a free distal portion and a free proximal portion; and
   wherein the free proximal portion and the free distal portion are asymmetrical.

22. The gasket according to claim 21, wherein the free distal portion of each spring arm is adaptable for contacting a first component adjacent to the first surface of the body and the free proximal portion each spring arm is adaptable for contacting a second component adjacent to the second surface of the body.

23. The gasket of claim 22, wherein a distance between the adjacent contacts with a component surface is less than or approximately equal to a predetermined ratio of a shielded radio wavelength.

24. The gasket of claim 22, wherein the gasket is formed of sheet metal.

25. The gasket of claim 22, wherein each spring arm is bent at the connection so that the distal portion projects upward beyond the first surface and the proximal portion projects downward beyond the second surface.

26. The gasket of claim 22, wherein the distance between adjacent contact points is approximately equal to 2.5 mm.

27. The gasket of claim 22, wherein the first component is a printed circuit board and the second component is a frame.

* * * * *